United States Patent [19]
Tokura

[11] Patent Number: 5,418,691
[45] Date of Patent: May 23, 1995

[54] TWO PRINTED CIRCIUT BOARDS SUPERIMPOSED ON ONE ANOTHER BOTH HAVING POSITION REGISTRY MARKS

[75] Inventor: Go Tokura, Kanagawa, Japan

[73] Assignee: Canon Kabushiki Kaisha, Tokyo, Japan

[21] Appl. No.: 978,043

[22] Filed: Nov. 18, 1992

Related U.S. Application Data

[63] Continuation of Ser. No. 650,903, Feb. 5, 1991, abandoned.

[30] Foreign Application Priority Data

Feb. 7, 1990 [JP] Japan ................ 2-27721
May 31, 1990 [JP] Japan ............. 2-57834 U

[51] Int. Cl.⁶ .............. H05K 1/11; H01R 29/00; H01R 9/09
[52] U.S. Cl. ................... 361/803; 174/254; 174/255; 174/261; 174/263; 174/268; 361/749; 361/786; 361/790; 361/792; 439/47; 439/67; 439/77; 439/83
[58] Field of Search ........... 174/254, 261, 255, 263, 174/268; 361/397, 398, 403, 409, 412, 414, 749, 786, 803, 790, 792; 439/67, 77, 83, 47; 228/179.1

[56] References Cited

U.S. PATENT DOCUMENTS

| | | | |
|---|---|---|---|
| 4,538,210 | 8/1985 | Schaller | 361/401 |
| 4,795,079 | 1/1989 | Yamada | 228/179.1 |
| 4,799,129 | 1/1989 | Izumino | 361/413 X |
| 4,950,527 | 8/1990 | Yamada | 361/398 X |

FOREIGN PATENT DOCUMENTS

| | | | |
|---|---|---|---|
| 2515917 | 5/1983 | France | 439/77 |
| 001-6385 | 1/1989 | Japan | 439/83 |
| 1-289189 | 11/1989 | Japan | 439/67 |
| 0209788 | 8/1990 | Japan | 439/83 |
| 2-304877 | 12/1990 | Japan | 439/77 |
| 03-22490 | 1/1991 | Japan | 439/77 |
| 3-231487 | 10/1991 | Japan | 439/77 |
| 4-253392 | 9/1992 | Japan | 439/67 |

*Primary Examiner*—Leo P. Picard
*Assistant Examiner*—Donald A. Sparks
*Attorney, Agent, or Firm*—Robin, Bleckerm, Daley & Driscoll

[57] ABSTRACT

A printed circuit board device comprising at least two printed circuit boards in superposition to connect their interconnection patterns, and a positioning member for putting the two boards into registry when being superimposed, the positioning member including a hole provided in one of the boards, an extension provided on the other board and arranged to be inserted into the hole, and a pair of marks for position registry provided on the respective boards.

35 Claims, 12 Drawing Sheets

TWO PRINTED CIRCIUT BOARDS SUPERIMPOSED ON ONE ANOTHER BOTH HAVING POSITION REGISTRY MARKS

This is a continuation of prior application Ser. No. 650,903, filed Feb. 5, 1991, now abandoned.

BACKGROUND OF THE INVENTION

1. Field of the Invention

This invention relates to a printed circuit board device having a structure for positioning a plurality of printed circuit boards on each other.

2. Description of the Related Art

The conventional positioning structure for use in connecting printed circuit boards with each other is shown in FIGS. 10 and 11. To electrically connect a first flexible printed circuit board 21 and a second flexible printed circuit board 22, it is the common method that nail plate-like projection pieces 24 for interconnection formed in the second flexible printed circuit board 22 are superimposed on respective exposed copper foil patches 23 for interconnection on the first flexible printed circuit board 21 and then heaped with solder 25. Since, at this time, positioning must be made to establish good registry between the patches 23 and the pieces 24 in each pair, a pair of positioning dowels 27 are erected on a support plate 26 for the first board 21. The two boards 21 and 22, on the other hand, are provided with two positioning holes 28 and 29 arranged so that when both boards 21 and 22 are superimposed with the holes 28 and 29 fitted on the dowels 27, a good positional relationship is automatically established in each pair of the aforesaid exposed copper foil patch 23 for interconnection and the aforesaid nail plate-like projection piece 24 for interconnection.

In the conventional example described above, because, in addition to the two flexible printed circuit boards to be connected, there is need to employ the support plate member on which the positioning dowels are provided, and because every one of the aforesaid two boards has to have two positioning holes, there are the following drawbacks:

(1) If the support plate member on which the positioning dowels are provided is not disposed in appropriate locations, another member on which the positioning dowels are provided must be prepared. This leads to an increase in the number of parts.

(2) The necessity of forming two positioning holes in each of the paired flexible printed circuit boards to be connected results in a complicated structure of the connector portions of every one of both boards. To cope with this complexity, the flexible printed circuit board has to increase in size and, therefore, in production cost.

(3) The density of installation is lowered by an amount equal to the size of the additional space occupied by the positioning holes and their reinforcing neighborhood.

(4) A high precision accuracy is required for making up the two positioning holes in each of the printed circuit boards in prescribed relation to each other and to both of the exposed copper foil patch of the first board and the projection piece of the second board. Therefore, the production cost of the flexible printed circuit boards increases greatly.

SUMMARY OF THE INVENTION

One aspect of this invention is to make use of a registry mark in positioning first and second printed circuit boards in superimposed relation when connecting them with each other. The registry mark is located across one of the side edges of both boards. Moreover, a hole is formed in the first board in alignment with the registry mark, while an extension which is to be inserted into the hole is formed on the second board in alignment with the registry mark. Hence, it becomes possible to provide a printed circuit board device of simple structure, while still permitting accurate and steadfast connection to be done.

DETAILED DESCRIPTION OF THE PREFERRED EMBODIMENTS

Figure 1:
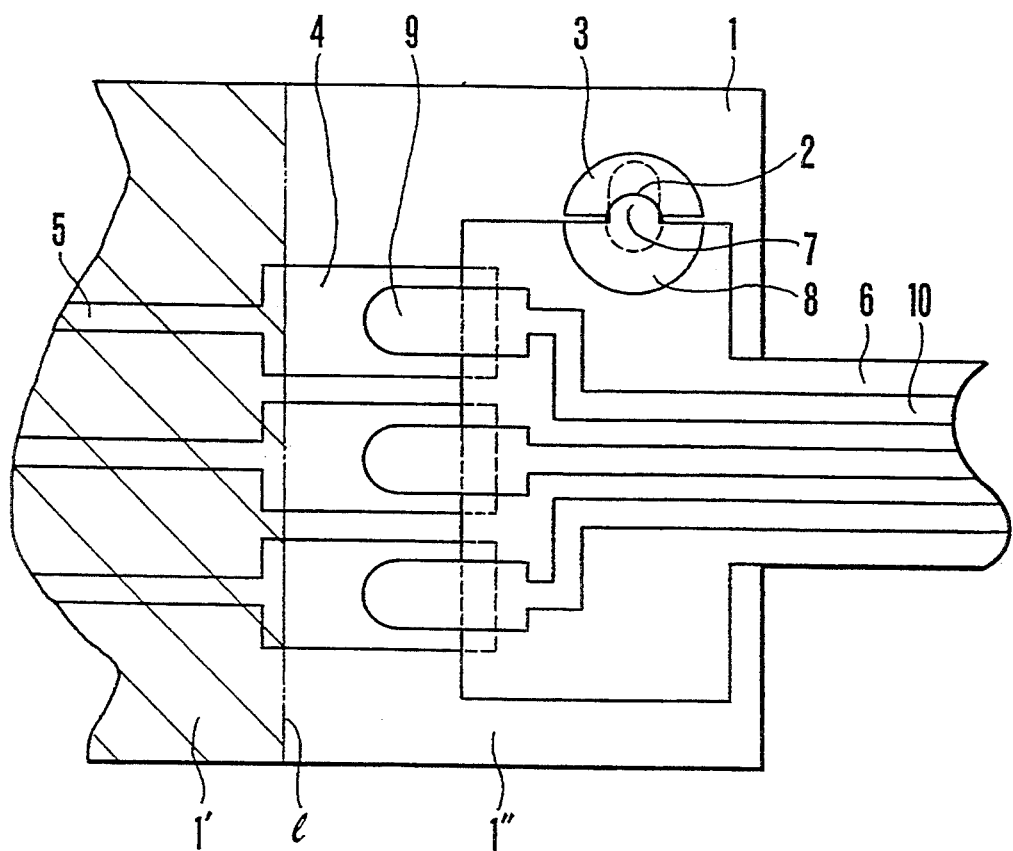
FIG. 1 is a top view illustrating a first embodiment of the invention where first and second flexible printed circuit boards are superimposed on each other.

FIG. 1 in top view shows a first embodiment of the invention. A first flexible printed circuit board 1 and a second flexible printed circuit board 6 are adjusted in relative position to each other, so that the latter is superimposed on the former, before soldering is carried out on their interconnection wiring patterns. The aforesaid first flexible printed circuit board 1 is provided with a positioning hole 2. The upper half, as viewed in the figure, of an environment surrounding the hole 2 is reinforced by a copper foil 3. Exposed copper foil patches 4 for interconnection (or connection lands) are arrayed on the aforesaid first flexible printed circuit board 1 and have respective lead patterns 5. A cover lay film (electrically insulating film) whose border is indicated by 1 is laid on an area 1' of the first flexible printed circuit board 1, the remaining area 1" of which is exposed to the air, leaving the copper foil patches cleared of the cover. The aforesaid second flexible printed circuit board 6 is provided with a positioning nail-shaped extension 7. A copper foil 8 for reinforcement is formed both on this extension and on a semicircle at the root of the extension 7.

Nail plate-like projection pieces 9 for interconnection are cleared of the cover lay film. So, their copper foils are exposed to the air and have respective lead patterns 10 arrayed on the second flexible printed circuit board 6.

Figure 2A:
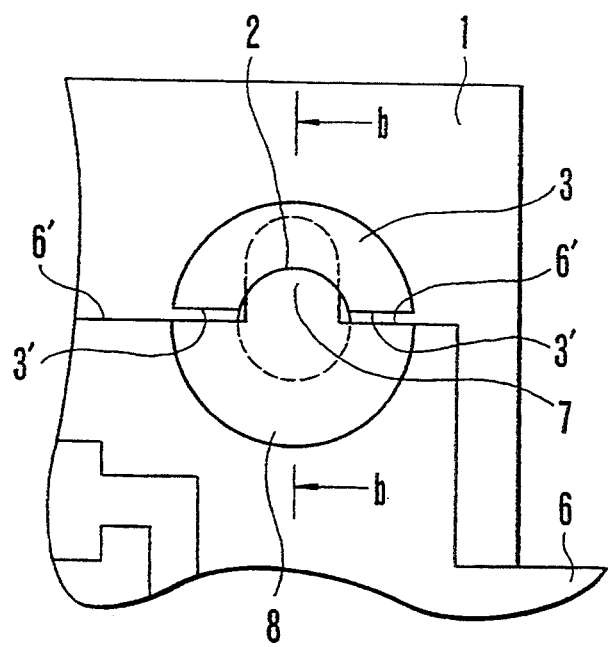
FIG. 2(a) is a fragmentary plan view in an enlarged scale of the paired positioning registry structures of both boards of FIG. 1.
Figure 2B:
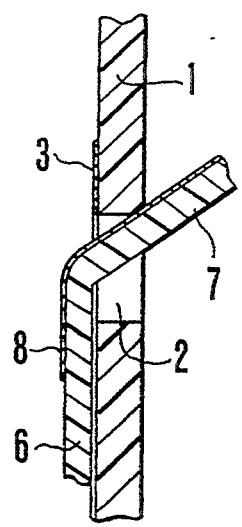
FIG. 2(b) is a cross-sectional view taken along b—b line of FIG. 2(a).

FIG. 2(a) shows the enlargement of the positioning hole 2 and its neighborhood, and FIG. 2(b) shows their b—b cross-sections.

The shape of the copper foil 3 for reinforcement disposed around the positioning hole 2 consists of concentric semicircles with linear side edges 3'. These linear side edges 3' are so arranged that with the second flexible printed circuit board 6 having its nail-shaped extension 7 inserted in the positioning hole 2, when the second board 6 turns about the hole 2 to a position where the projection pieces 9 come in interconnection registry with the exposed patches 4, in other words, when both boards 1 and 6 take their predetermined relative positions, the linear side edges 3' are in parallel with the linear side edges 6' of the semicircle which is at the root of the nail-shaped extension 7 of the second flexible printed circuit board 6. Also, on the nail-shaped extension 7 and an area neighboring its root, the latter, too, being of a semicircle, there is formed the copper foil 8 for reinforcement, which is adjusted in size so that when the second flexible printed circuit board 6 is in the right angular position for interconnection, it constitutes an apparent circle together with the outer semicircle of the copper foil 3 for reinforcement which is disposed around the positioning hole 2. With the help of this, one can immediately visually discriminate when both printed circuit boards 1 and 6 fall in the predetermined positional relation to each other. Another feature is that when both printed circuit boards 1 and 6 are in the predetermined positional relation, a slight gap appears between the linear side edge 3' and the linear side edge 6'. If the aforesaid rotative movement is carried out until the gap appearing therebetween becomes uniform in width over the entire length, accurate establishment of the predetermined relation of both printed circuit boards 1 and 6 is very easily achieved.

Figure 3:
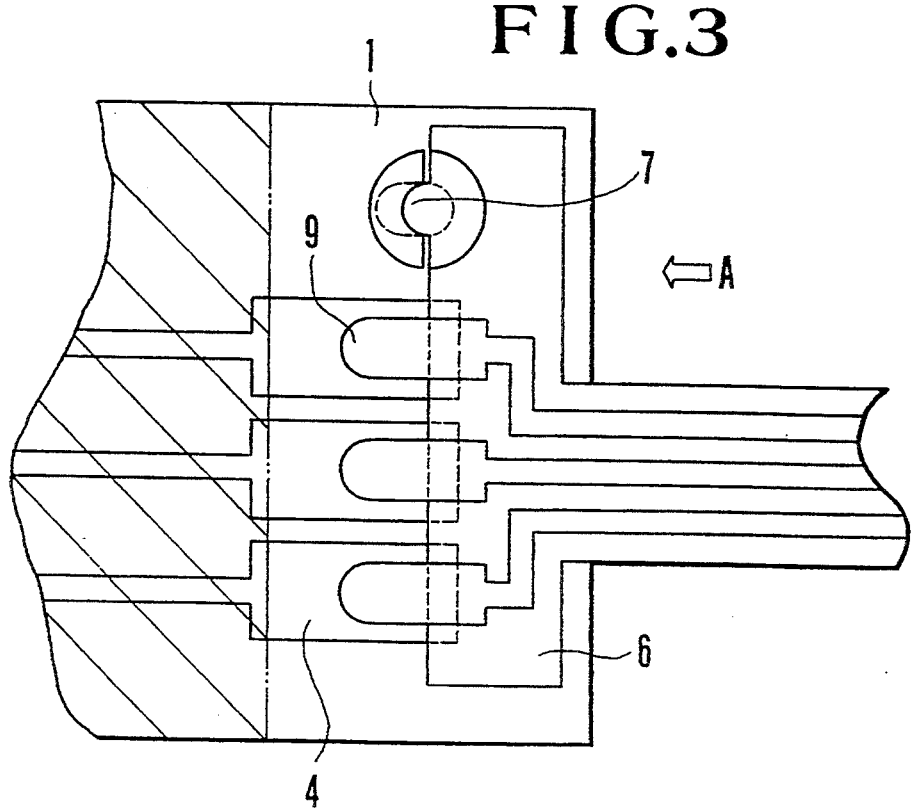
FIG. 3 is a top view illustrating an example of variation of a first embodiment of the invention.
Figure 4:
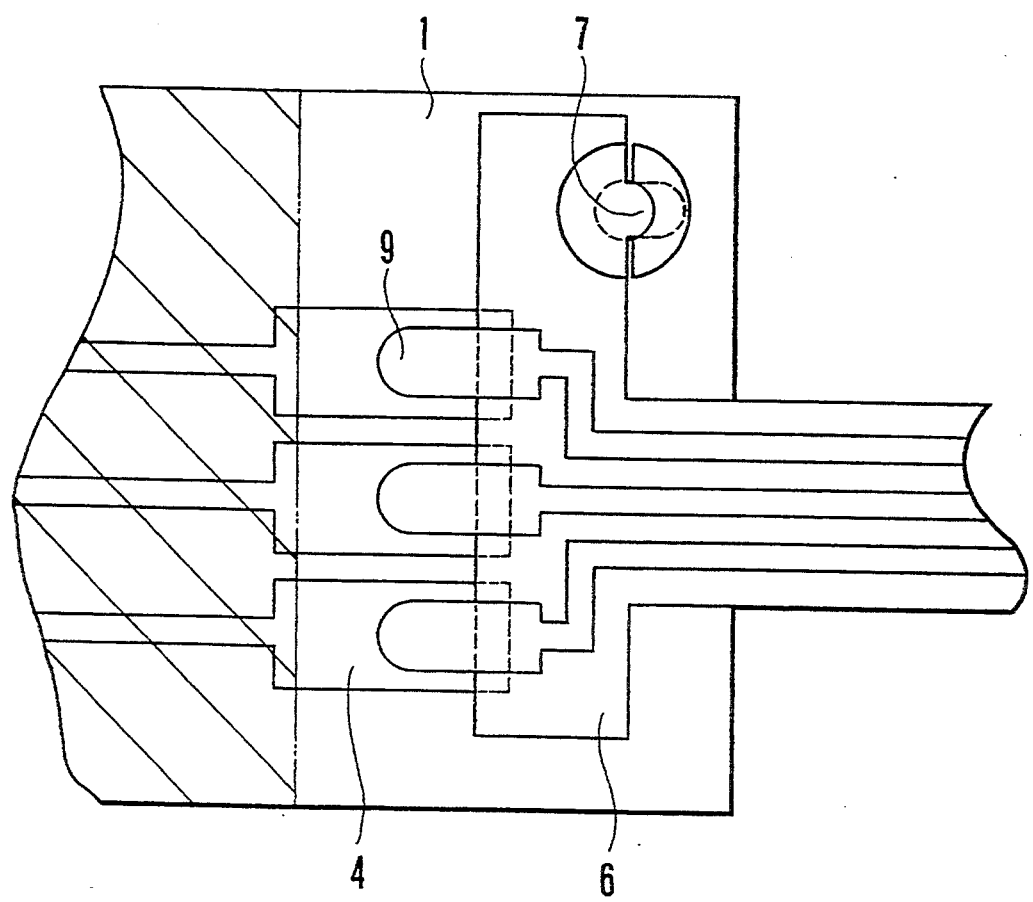
FIG. 4 is a similar view illustrating another example of a variation of the first embodiment.

Examples of variation of the first embodiment are shown in FIG. 3 and FIG. 4. While, in the first embodiment shown in FIG. 1, the nail-shaped extension 7 for positioning provided in the second flexible printed circuit board 6 protrudes in an almost perpendicular direction to that of the nail plate-like projection pieces 9 for interconnection, the nail-shaped extension 7 for positioning may otherwise be placed on the same side edge and in the same direction as the nail plate-like projection pieces 9 for interconnection, as shown in FIG. 3'. In the case of FIG. 3, or in a case where the front side edge of the second flexible printed circuit board 6 is elongate in the direction of disposition of the nail plate-like projection pieces 9 for interconnection, owing to the fact that it is natural to advance the second flexible printed circuit board 6 in a direction indicated by arrow A in FIG. 3 when both boards are placed in superposition, an improvement of the efficiency of assembling operations can be afforded.

Another example is that as shown in FIG. 4, the nail-shaped extension 7 for positioning may otherwise be placed so as to protrude in the direction opposite to that of the nail plate-like projection pieces 9 for interconnection. In this case, if the front side of the second flexible printed circuit board 6 is elongate in the direction of disposition of the nail plate-like projection pieces 9 for interconnection or in the lateral direction and a pulling force works in the longitudinal direction, an additional advantage that the second flexible printed circuit board 6 is preliminarily kept in the predetermined position can be produced.

Figure 5:
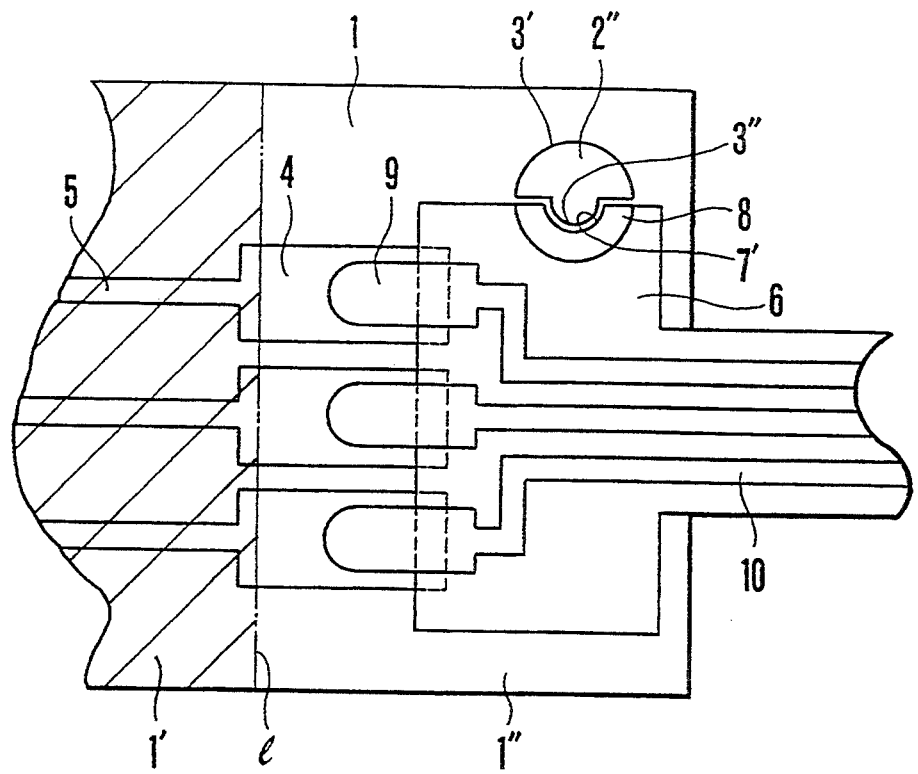
FIG. 5 is a top view illustrating a second embodiment.
Figure 6:
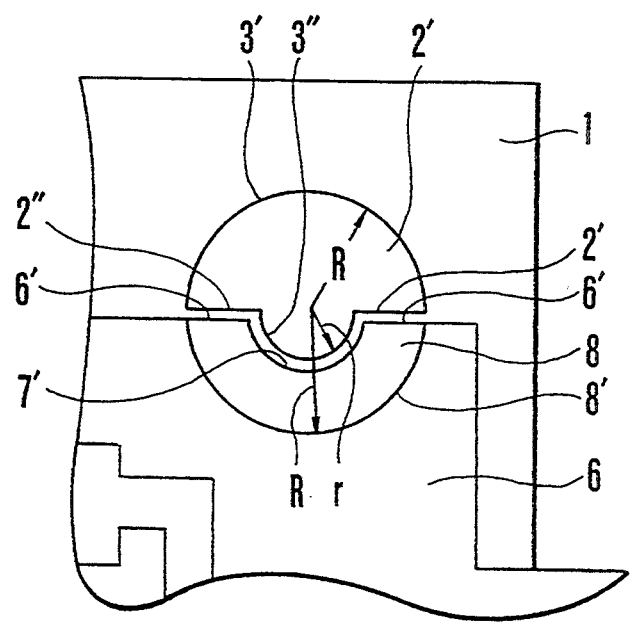
FIG. 6 is a plan view in an enlarged scale of the main parts of FIG. 5.

A second embodiment is shown in FIGS. 5 and 6, where a copper foil member provided on the first printed circuit board 1 and that portion of the side edge of the second printed circuit board 6 which confronts the copper foil member are formed to such a shape that their superposed joint edges are not only in the linear parallel relation but also in semicircular concave/convex areal relation to each other, thus giving a registry mark for assisting in positioning both printed circuit boards relative to each other. Because obviating the necessity of using the positioning hole in either of the circuit boards, the circuit boards are prevented from becoming brittle. Another aim is to make higher the density of installation.

In FIG. 5, reference numerals 1 and 6 denote respectively first and second flexible printed circuit boards the latter superimposed on the former in a position-adjusted state. 2" denotes the copper foil member for positioning provided on the first flexible printed circuit board 1 and having an arc-shaped convex portion 3".

A plurality of exposed copper foil patches 4 for interconnection (connection lands) are arrayed side by side on the aforesaid first flexible printed circuit board 1 and have the respective wiring patterns 5. 1 denotes the border of the cover lay film. An area 1' is covered by the cover lay film. In another area 1", the arrayed copper foil patterns are exposed to the air. An arc-shaped concave portion 7' is formed in the side edge of the second flexible printed circuit board 6 and is surrounded by a copper foil 8 for reinforcement.

Nail plate-like projection pieces 9 are not covered by the cover lay film (electrically insulating film) so that the copper foil is exposed to the air. Wiring patterns 10 are arrayed on the aforesaid second flexible printed circuit board 6. FIG. 6 shows the enlargement of the aforesaid copper foil member 2" for positioning and its neighborhood. The shape of this copper foil member 2" for positioning is formed with an arc-shaped convex portion 3" of a small radius r, a semicircular end portion 3' of a large radius R, and its diameter or straight line segments 2'. The aforesaid arc-shaped concave portion 7' formed in the side edge of the second flexible printed circuit board 6 is concentric with the aforesaid arc-shaped convex portion 3" and its radius is set to be somewhat larger than the radius r, so that when both flexible printed circuit boards 1 and 6 are superimposed on each other in a predetermined positional relation, the aforesaid arc-shaped convex portion 3" does not overlap the aforesaid arc-shaped concave portion 7', but these abut with a slight gap therebetween. That is, straight line segments 2' of the copper foil member 2" for positioning, when both flexible printed circuit boards 1 and 6 are in the predetermined positional relation, are juxtaposed with the straight line portions 6' of the side edge of the second flexible printed circuit board 6 in parallel and in such a way that a gap appears therebetween. Further, the semicircle 8' of the copper foil 8 for reinforcement is formed so that when both flexible printed circuit boards 1 and 6 are in the predetermined positional relation, it is concentric with the arc 3' of the copper foil member 2" for positioning, and its radius is the same as the radius R. Thus, these parts assist in position registry.

Figure 7:
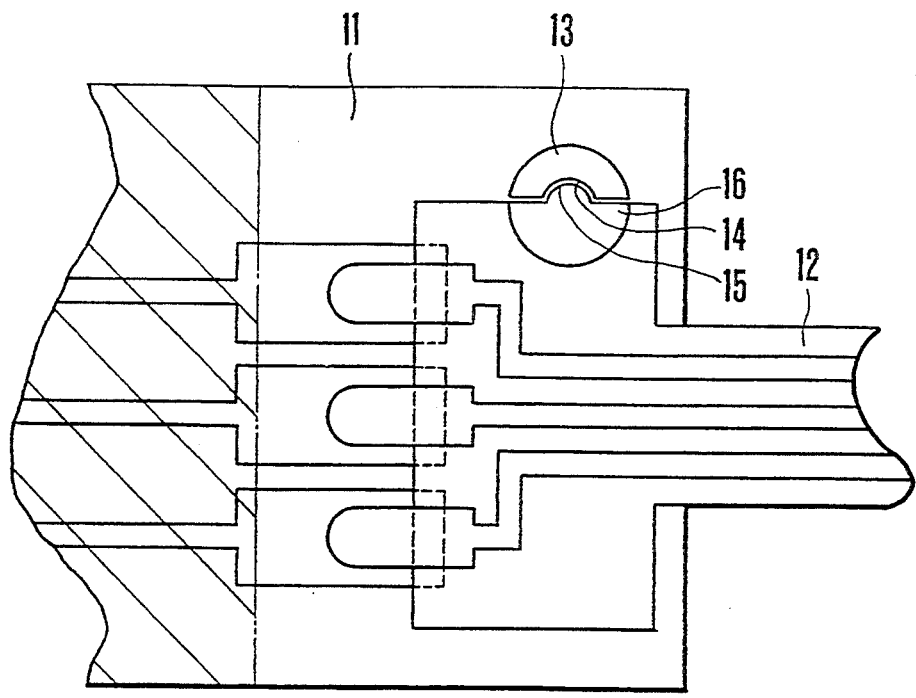
FIG. 7 is a top view illustrating an example of a variation of the second embodiment.
Figure 8:
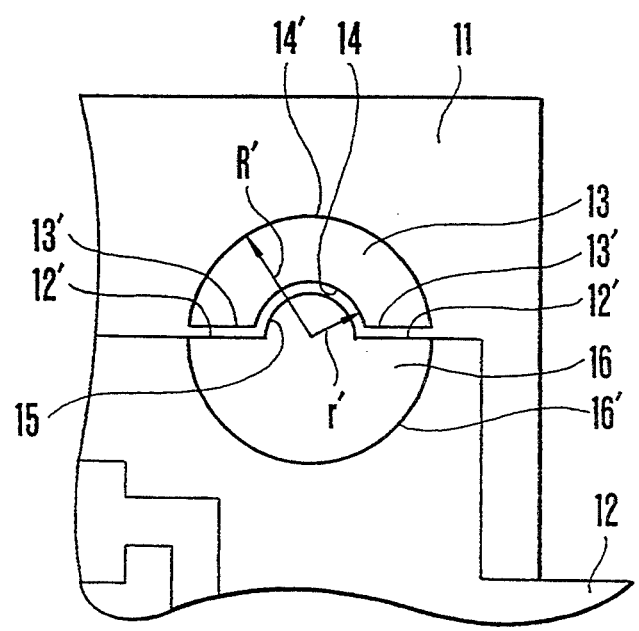
FIG. 8 is a plan view in an enlarged scale of the main parts of FIG. 7.

FIG. 7 shows a variation of the second embodiment and FIG. 8 shows the enlargement of its parts. Reference numeral 13 denotes a copper foil member for positioning provided on a first flexible printed circuit board 11, and 14 denotes an arc-shaped concave portion of the copper foil member 13 for positioning. 15 denotes an arc-shaped convex portion formed in the side edge of a second flexible printed circuit board 12 and surrounded by a copper foil 16 for reinforcement. The shape of the copper foil member 13 is formed with the arc-shaped concave portion 14 of a small radius r', an arc 14' of a large radius R' and straight line segments 13'. The arc-shaped convex portion 15 formed in the side edge of the second flexible printed circuit board 12 is concentric with the aforesaid arc-shaped concave portion 14, having its radius set to be somewhat shorter than the radius r', and is arranged so that when both flexible printed circuit boards 11 and 12 are in the predetermined positional relation, it does not overlap the arc-shaped concave portion 14, but is juxtaposed with it with a slight gap therebetween. That is, the straight line segments 13' of the copper foil member 13 for positioning, when both flexible printed circuit boards 11 and 12 are in the predetermined positional relation, are formed in parallel with, and spaced from, the straight line segments 12' of the side edge of the second flexible printed circuit board 12. Further, the semicircle 16' of the copper foil 16 for reinforcement, when both flexible printed circuit boards 11 and 12 are in the predetermined positional relation, is formed so as to be concentric with the arc 14' of the copper foil member 13 for positioning and to have the same radius as the radius R'. Thus, these parts function in position registry.

Figure 9:
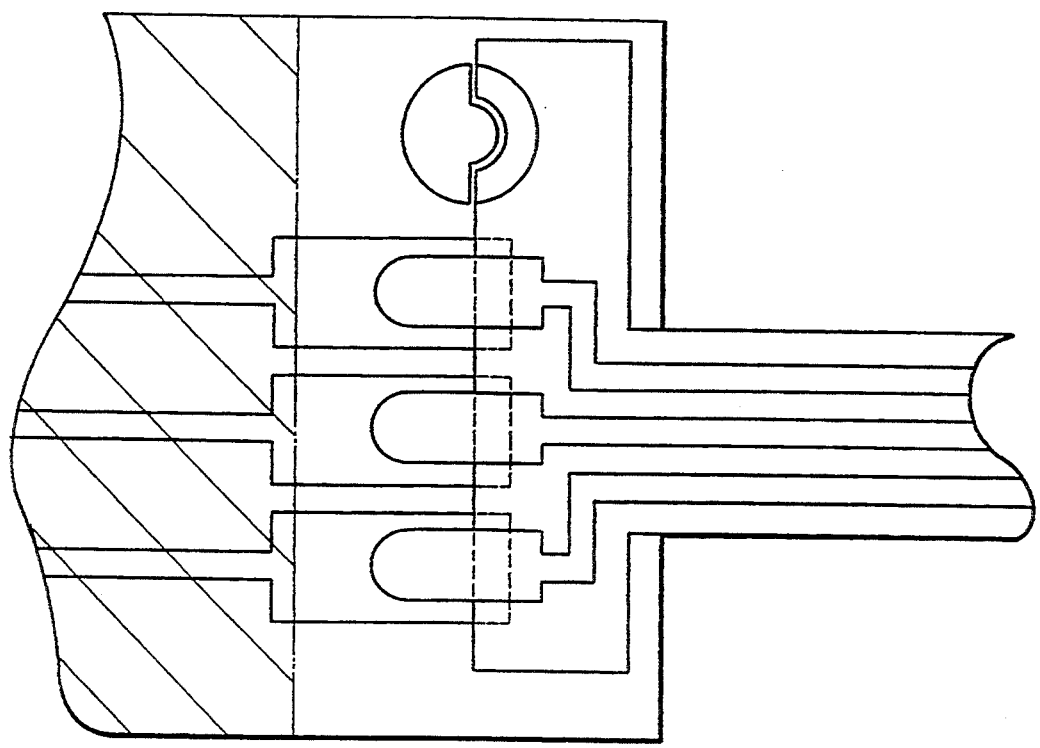
FIG. 9 is a top view illustrating another example of a variation of the second embodiment.
Figure 10:
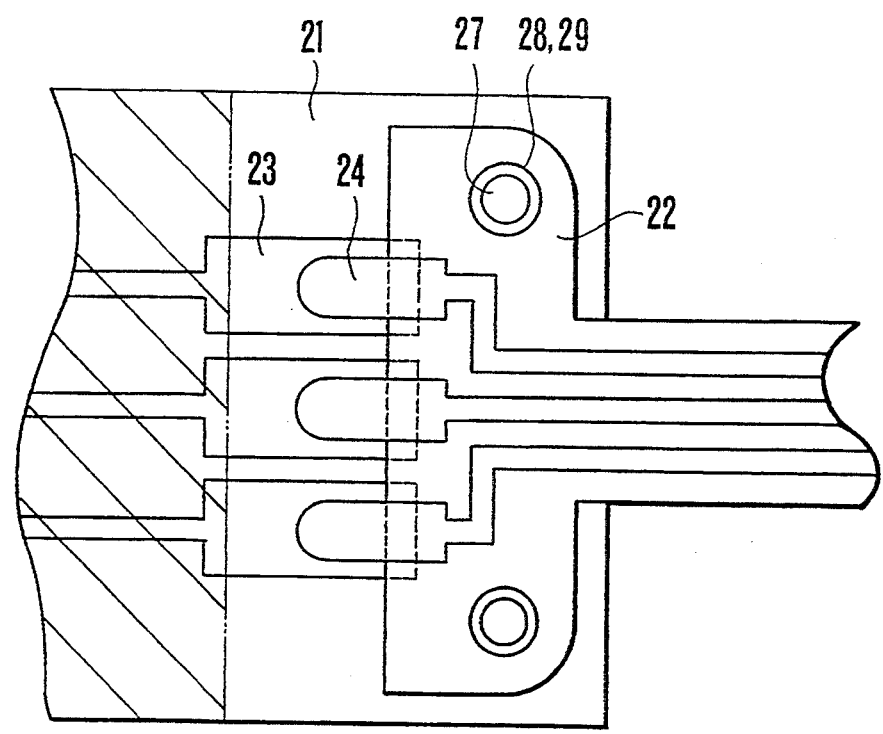
FIG. 10 and FIG. 11 are respectively a top view and a side sectional view of the conventional example.
Figure 11:
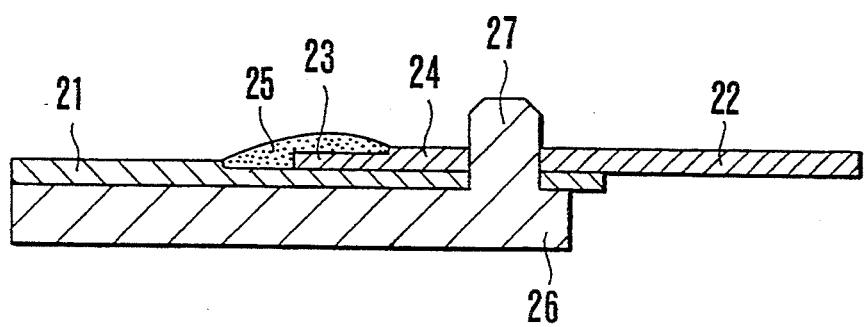

An example of a variation of the second embodiment is that as shown in FIG. 9, where the positioning structure may be formed in the front end edge having an array of nail plate-shaped projection pieces.

The positioning structure of this embodiment comprises two copper foil members. Since these, when in the predetermined positions, are juxtaposed with each other, both copper foil members may be soldered to make more steady the fixedly secured state of both printed circuit boards. It is also possible to utilize this positioning portion itself as a electrically connecting portion.

Particularly in an application to a case where after the second flexible printed circuit board and has electrically been connected to the first printed circuit board, the second printed circuit board is folded back, the positioning structure of the invention may be provided in two or more places. If so, it is also possible to use one of them as the aforesaid fixedly securing means by soldering.

In the above-described embodiments, within the first printed circuit board, the copper foil for reinforcement provided in the neighborhood of the hole for positioning and the exposed copper foil patches for pattern connection are formed by patterning and etching techniques. Therefore, their positional relationship is very high in precision accuracy. Also, even within the second printed circuit board, the positional relationship of the nail-shaped extension for positioning and the semicircular copper foil at or near its root with the nail plate-shaped projection pieces for interconnection, because the punching frame is used in formation, is easy to establish with high accuracy. In other words, the positioning structure according to the invention has many advantages. Firstly, it is possible to prepare its members in high accuracy. Secondly, according to the above-described embodiments, because the positioning members are constructed with the straight line portions and arc-shaped portions, it is possible to do positioning of both members visually with ease and accurately. Further, to enhance the positioning accuracy and the productivity, only one hole is sufficient on the first printed circuit board side. Therefore, for both of the first and second printed circuit boards, the wiring density can be increased. Thus, an even higher density of installation is realized, and an additional advantage of reducing the production cost owing to the advance in the minimization of the printed circuit boards is produced.

Thirdly, in addition to the registry mark function described secondly above, adhesion of boards by soldering is even possible as necessity arises.

As has been described above, the structure that is able to perform these many functions at once can be obtained without having to use special processes but is within the range of steps of the process for producing the printed circuit boards. Hence, the present invention gives great advantages to the industry.

Figure 12:
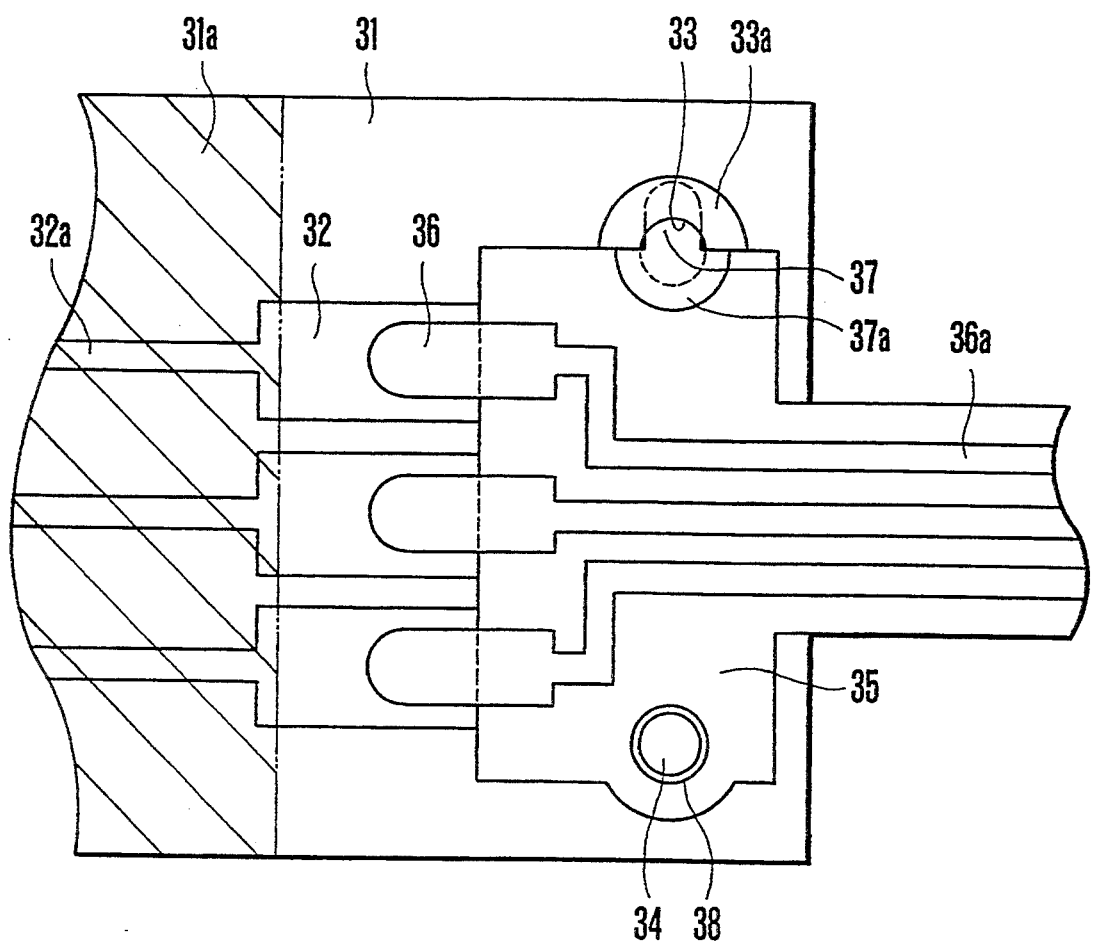
FIG. 12 is a plan view illustrating a third embodiment of the invention.
Figure 13:
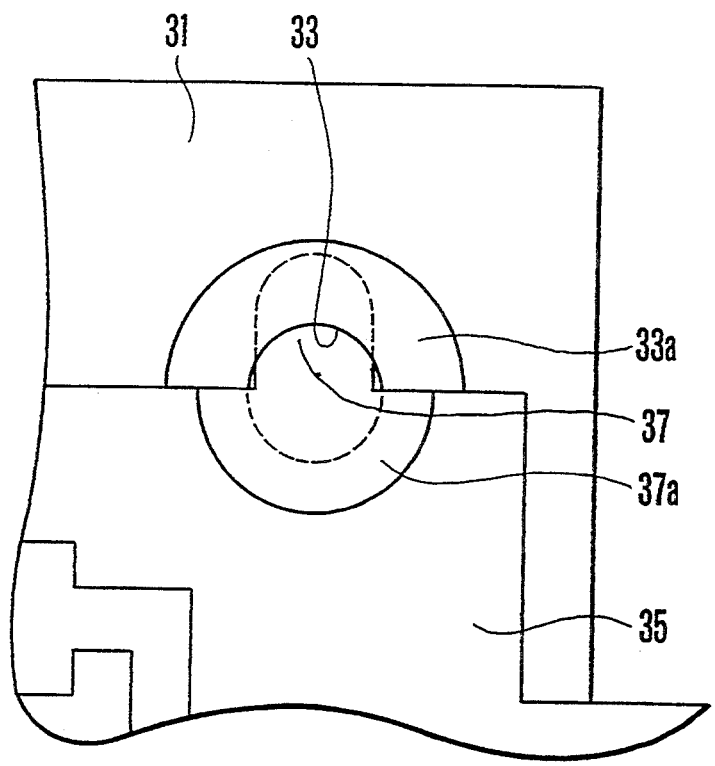
FIG. 13 is a fragmentary plan view in an enlarged scale of the device of FIG. 12.
Figure 14:
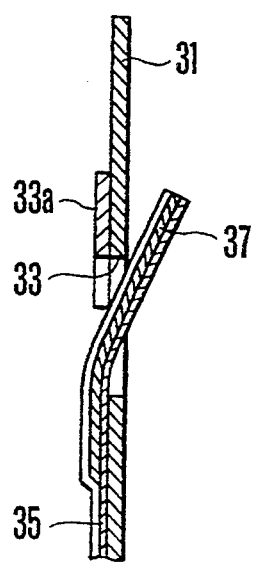
FIG. 14 is a cross-sectional view of the part shown in FIG. 13.

FIG. 12 in plan view shows a third embodiment of the invention, FIG. 13 shows the enlargement of the main parts, and FIG. 14 shows their cross-section.

In FIG. 12 to FIG. 14, reference numeral 31 denotes a first flexible printed circuit board, of which a hatched area 31a is covered by a resist (insulating) layer. 32 denotes a copper foil for interconnection forming connection land portions, and 32a denotes wiring patterns. A hole 33 for positioning is provided near the aforesaid connection land portions and is reinforced in its environment by a copper foil 33a. A copper foil 34 for positioning is provided near the aforesaid connection land portions and has a round shape. On a second flexible printed circuit board 35, there are nail plate-like projection pieces 36 for interconnection and wiring patterns 36a. A nail-shaped extension 37 for positioning is provided near the aforesaid connection land portions, and its width is almost equal to the diameter of the round of the hole 33 for positioning within the first flexible printed circuit board 31. At and near the root of the nail-shaped extension 37, there is formed a copper foil 37a for reinforcement.

As the nail-shaped extension 37 for positioning is inserted in the hole 33 for positioning, the second flexible printed circuit board 35 is able to turn about the hole 33 for positioning. So, an outer diameter hole 38 is provided in the second flexible printed circuit board 35 in such a way that when both flexible printed circuit boards 31 and 35 are in a predetermined positional relation, the copper foil 34 for positioning provided on the first flexible printed circuit board 31 appears through the outer diameter hole 38. By this, the relative positions of the aforesaid two boards 31 and 35 are adjusted. Then, solder is applied across the connection. Thus, these two boards 31 and 35 are connected to each other. At this time, the outer diameter hole 38 comes to be concentric with the copper foil 34 for positioning. This event indicates the optimum positioning. Also, the diameter of the outer hole 38 is made slightly larger than the diameter of the copper foil 34 for positioning, thereby permitting the operator to recognize the round shape of the copper foil 34 for positioning when establishing the predetermined positional relation of both boards 31 and 35.

Figure 15:
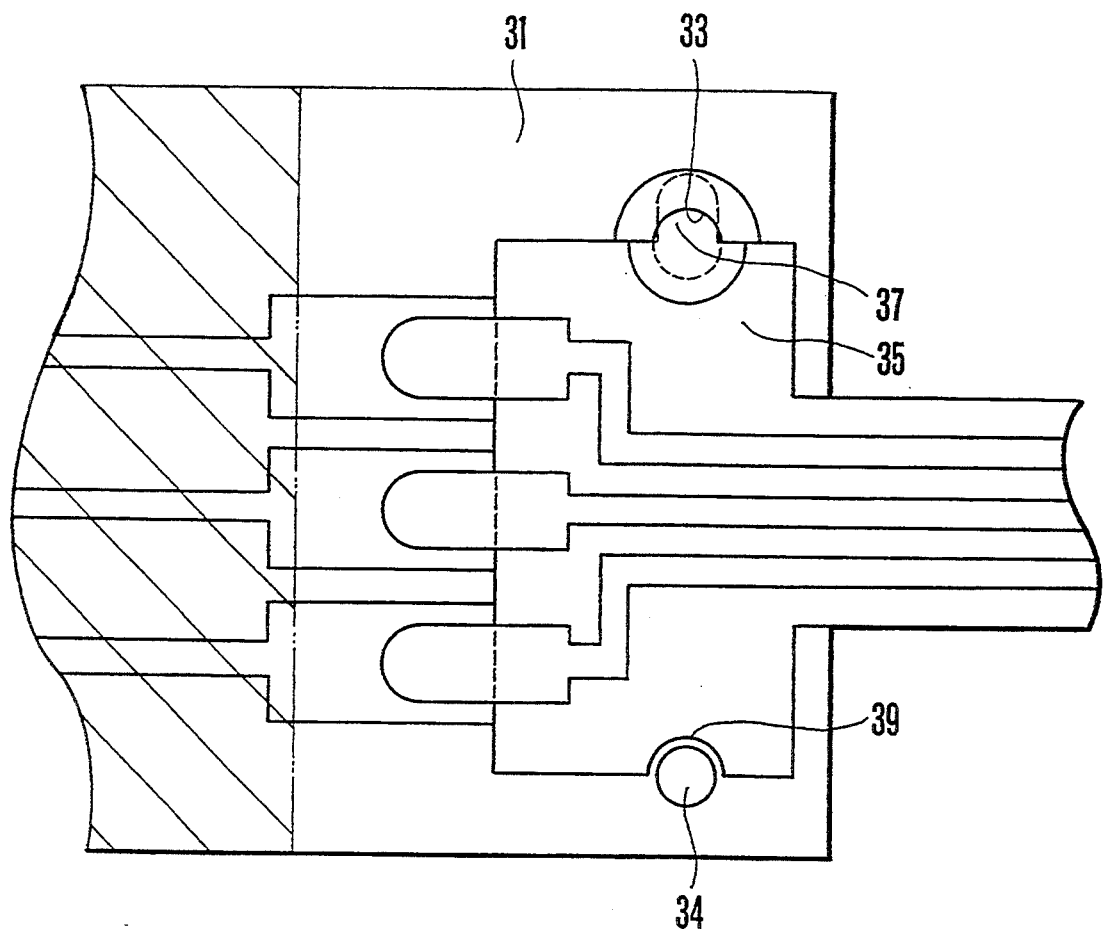
FIG. 15 is a plan view illustrating a fourth embodiment of the invention.

FIG. 15 shows a fourth embodiment of the invention. In this fourth embodiment, the nail-shaped extension 37 of the second flexible printed circuit board 35 is inserted into the hole 33 for positioning of the first flexible printed circuit board 31, and then an arc-shaped outer diameter concave portion 39 (in the areal direction) formed in the second flexible printed circuit board 35 is brought into registry with a round shape of the copper foil 34 for positioning on the first flexible printed circuit board 31. In such a manner, positioning of these two boards 31 and 35 is carried out. According to this, since the outer shape of the second flexible printed circuit board 35 has only half of a seemingly round hole as the positioning portion, because, as a result, the otherwise necessary other half of the hole is removed, the size of the board can be reduced.

Figure 16:
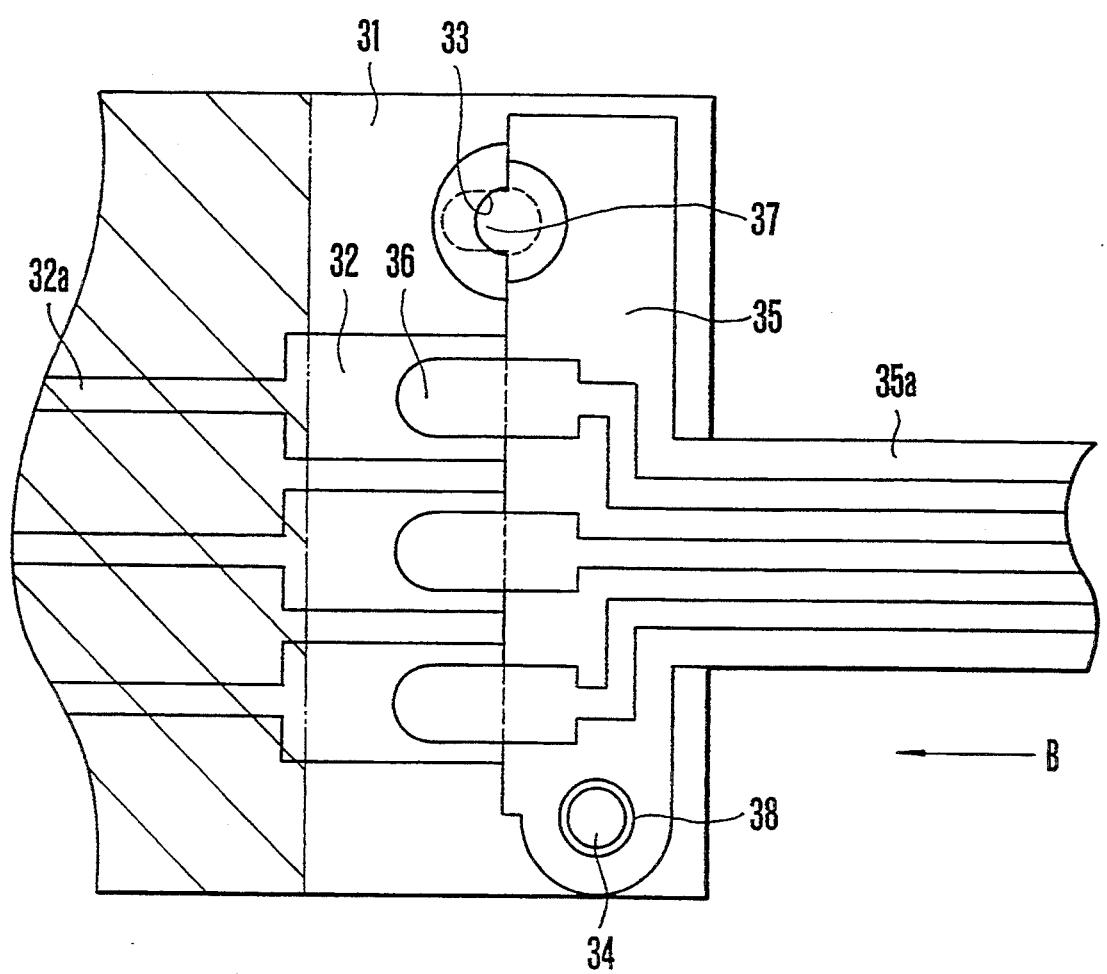
FIG. 16 is a plan view illustrating a fifth embodiment of the invention.

FIG. 16 shows a fifth embodiment of the invention. In this fifth embodiment, the nail-shaped extension 37 for positioning of the second flexible printed circuit board 35 is made to protrude in the same direction as the nail plate-like projection pieces 36 for interconnection. This is because, in a case where an armed portion 35a of the second flexible printed circuit board 35 expands as shown in FIG. 16, it is natural to put the board 35 into assembly from the direction indicated by arrow B. On this account, it is made to satisfy this assembling direction.

Figure 17:
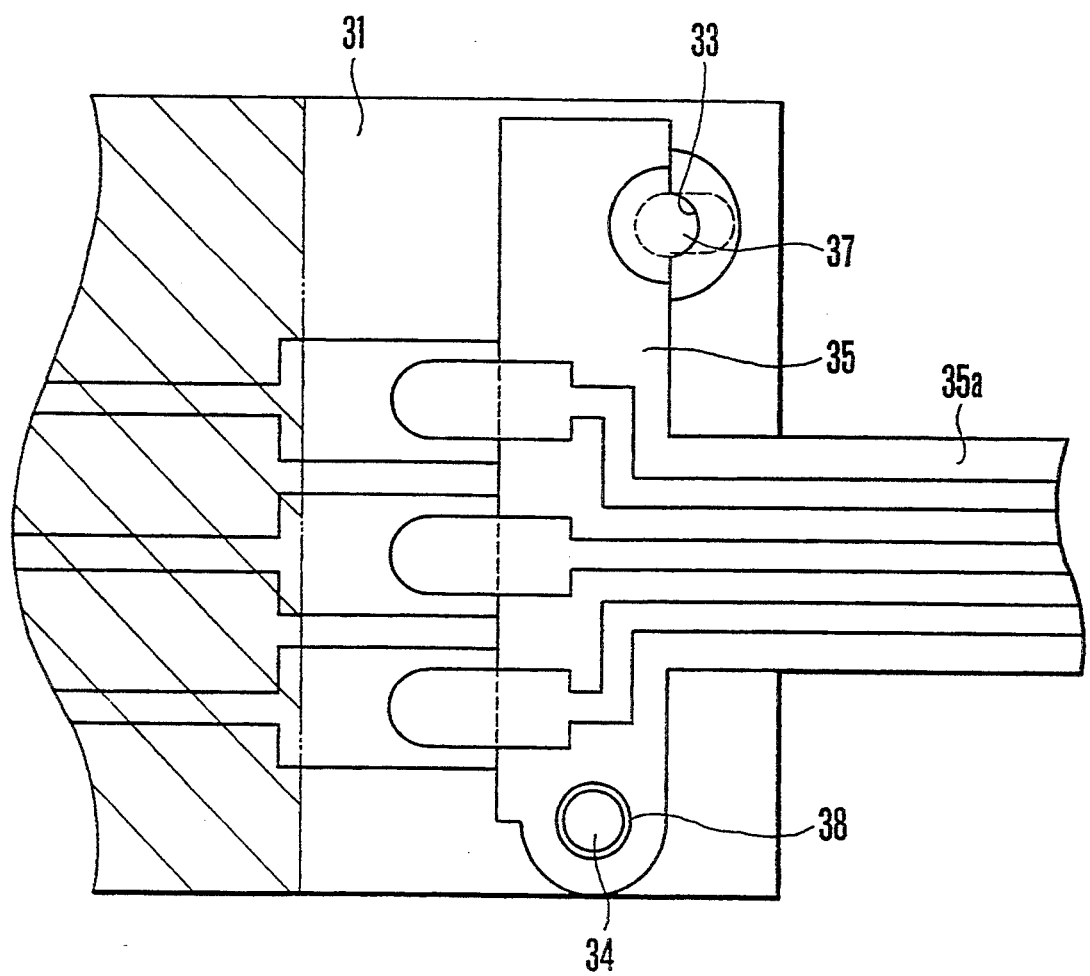
FIG. 17 is a plan view illustrating a sixth embodiment of the invention.

FIG. 17 shows a sixth embodiment of the invention. In this sixth embodiment, the nail-shaped extension 37 for positioning of the second flexible printed circuit board 35 is made to protrude in the same direction as that in which the armed portion 35a extends. This has been done by taking account of the stress exerted in the second flexible printed circuit board 35 when its armed portion 35a is pulled, playing a role of preventing slipping off from occurring.

As has been described above, according to the third to sixth embodiments, in the first printed circuit board there is provided a hole (or concave portion) for positioning and a copper foil for positioning near the interconnection portions of both printed circuit boards to be connected, while in the second printed circuit board there is the nail-shaped extension of almost the same width as the diameter of the hole (concave portion) for positioning provided in the aforesaid first printed circuit board, and this nail-shaped extension is formed in such a position that when both of the aforesaid printed circuit boards are in the predetermined positional relation, the nail-shaped extension can be inserted into the aforesaid hole (concave portion) for positioning. Moreover, the aforesaid second printed circuit board is provided with an outer diameter hole or concave portion in the position corresponding to the copper foil for positioning provided on the first printed circuit board. Therefore, the form is so simple that two sheets of printed circuit boards to be connected are only used, giving an advantage of realizing a connecting structure for the printed circuit boards at a low price. Also, within the first printed circuit board, the provided copper foil for positioning and the copper foils for interconnection are formed at once by etching or like practices. Therefore, their positional relationship is very high in precision accuracy. Within the second printed circuit board, the outer diameter hole for positioning and the nail plate-like projections for interconnection are formed in the general case by a common puncher. Therefore, their positional relation is easy to establish with high accuracy. And, what is important on determination of the positional relation of two printed circuit boards to be connected is the positional relation of the copper foils for interconnection of the first printed circuit board and the nail plate-like projections for interconnection of the second printed circuit board. According to the above-described embodiments, the copper foil for positioning of the first printed circuit board and the outer diameter hole for positioning on the second printed circuit board are finally adjusted in position to registry. Therefore, there is another advantage of establishing, with high accuracy, the positional relation of the parts which are important to positioning, namely, the copper foils for interconnection on the first printed circuit board and the nail plate-like projections for interconnection on the second printed circuit board. Further, because there is no need to provide more than only one outer diameter hole for positioning, both of the first and second printed circuit boards can be increased in wiring density. This leads to a higher density of installation and an advantage of reducing the production cost owing to the reduction of the size of the printed circuit boards. Also, as the nail-shaped extension for positioning of the second printed circuit board is inserted in the outer diameter hole for positioning of the first printed circuit board, both boards are held in the preliminary connected state. This affords an advantage of improving the productivity. Further, when soldering, the molten solder is prevented from ready egress. Hence, even an advantage of achieving an improvement in safety is produced.

What is claimed is:

1. A printed circuit board device comprising:
   (A) a first printed circuit board including:
   (A-1) a first pattern for connection;
   (A-2) a hole for positioning; and
   (A-3) a first mark for position registry located adjacent to said hole, said mark being comprised of the same substance as said first pattern; and
   (B) a second printed circuit board including:
   (B-1) a second pattern for connection to said first pattern for connection;
   (B-2) an extending portion insertable into said hole for positioning of said first printed circuit board; and
   (B-3) a second mark for position registry located adjacent to a root of said extending portion, said second mark for position registry being comprised of the same substance as said second pattern for connection,
   said second printed circuit board being superimposed on said first printed circuit board with said first pattern for connection and said second pattern for connection being disposed in position for mutual connection thereof, said extending portion of said second printed circuit board being resident in said hole for positioning of said first printed circuit board and said first mark for position registry and said second mark for position registry being in a preset positional relationship wherein said second printed circuit board is rotatable to some angle around said hole.

2. A device according to claim 1, wherein said second printed circuit board is a flexible printed circuit board.

3. A device according to claim 1, wherein said second printed circuit board further includes a reinforced part comprised of the same substance as said second printed circuit board and located in an area of said extending portion of said second printed circuit board.

4. A device according to claim 3, wherein the area of said extending portion and said second mark for position registry are contiguous.

5. A device according to claim 1, wherein said first and second marks for position registry each are of semicircular shape.

6. A device according to claim 5, wherein said first and second marks for position registry each are of semicircular shape of the same radius and, in said superimposed relation of said first printed circuit board and said second printed circuit board, said first and second marks jointly display a substantially round shape.

7. A device according to claim 1, wherein said first or second pattern for connection protrudes from a substrate of its respective said first or second printed circuit board.

8. A device according to claim 1, wherein said first and second patterns for connection each are plural in number and arrayed in a row.

9. A device according to claim 1, wherein said second pattern for connection of said second printed circuit board protrudes from a substrate of said second printed circuit board.

10. A printed circuit board device comprising:
(A) a first printed circuit board including:
   (A-1) a first pattern for connection; and
   (A-2) a first mark for position registry composed of a combination of a straight line and a curved line, said first mark being comprised of the same substance as said first pattern; and
(B) a second printed circuit board including:
   (B-1) a second pattern for connection to said first pattern for connection; and
   (B-2) a second mark for position registry composed of a combination of a straight line and a curved line, said second mark being comprised of the same substance as said second pattern for connection, said combination of said straight line and said curved line of said second mark includes an edge portion of said second printed circuit board,
said first printed circuit board and said second printed circuit board being in superimposed relation, said first pattern for connection and said second pattern for connection being in position for connection with each other, said straight lines and said curved lines of said first mark for position registry and said second mark for position registry respectively coinciding with each other and at the time of connection of said first pattern and said second pattern, said first mark and said second mark not superimposing with each other.

11. A device according to claim 10, wherein at least one of said first and second printed circuit boards is a flexible printed circuit board.

12. A device according to claim 10, wherein said first and second marks for position registry each are of semicircular configuration.

13. A device according to claim 12, wherein said first and second marks for position registry each have an arc of the same radius and wherein, in said superimposed relation of said first printed circuit board and said second printed circuit board, said arcs jointly form a substantially round shape.

14. A device according to claim 10, wherein said first or second pattern for connection is formed to protrude from a substrate of its respective said first or second printed circuit board.

15. A device according to claim 10, wherein said first and second patterns for connection each are plural in number and arrayed in a row.

16. A printed circuit board device comprising:
(A) a first printed circuit board including:
   (A-1) a first pattern for connection;
   (A-2) a hole for positioning; and
   (A-3) a mark for position registry comprised of the same substance as said pattern; and
(B) a second printed circuit board including:
   (B-1) a second pattern for connection to said first pattern for connection;
   (B-2) an extending portion insertable into said hole for positioning of said first printed circuit board; and
   (B-3) a cutout for position registry,
said first printed circuit board and said second printed circuit board being in superimposed relation and said first pattern for connection and said second pattern for connection being in position for connection with each other, said extending portion being inserted into said hole for positioning, and said mark for position registry and said cutout for position registry having a preset certain positional relationship.

17. A device according to claim 16, wherein said second printed circuit board is a flexible printed circuit board.

18. A device according to claim 16, wherein said second printed circuit board further includes a reinforced part comprised of the same substance as said second printed circuit board and located in an area of said extending portion of said second printed circuit board.

19. A device according to claim 16, wherein said mark for position registry is round in shape, and wherein said cutout for position registry also is round in shape and has a larger diameter than that of said mark for position registry.

20. A device according to claim 16, wherein said mark for position registry is round in shape, and wherein said cutout for position registry is semicircular in shape and has a larger diameter than that of said mark for position registry.

21. A device according to claim 16, wherein said first or second pattern for connection protrudes from a substrate of its respective said first or second printed circuit board.

22. A device according to claim 16, further comprising a second mark for position registry located adjacent to said hole for positioning and a third mark for position registry formed adjacent to a root of said extending portion.

23. A device according to claim 16, wherein said second pattern for connection of said second printed circuit board protrudes from a substrate of said second printed circuit board.

24. A printed circuit board device, comprising:
(A) at least two printed circuit boards in superimposed relation to connect patterns thereon with one another; and (B) positioning means for use in placing said printed circuit boards in said superimposed relation, said positioning means including a hole provided in one of said printed circuit boards, an extending portion provided in the other printed circuit board and inserted into said hole, and marks for position registry provided on each of said printed circuit boards, said marks for positioning registry are of semicircular configuration and of the same diameter and wherein, in said superimposed relation of said printed circuit boards for interconnection of said patterns for connection, said marks for position registry jointly form a substantially round shape.

25. A device according to claim 24, wherein said printed circuit boards are flexible printed circuit boards.

26. A device according to claim 24, wherein said patterns for connection and said mark are comprised of a same copper foil.

27. A device according to claim 24, wherein at least one of said patterns for connection protrudes from a substrate of one of said printed circuit boards.

28. A device according to claim 24, wherein said patterns for connection each are plural in number and arrayed in a row.

29. A device according to claim 24, wherein said mark for positioning registry of one of said printed circuit boards is located adjacent to said hole, and wherein said mark of the other printed circuit board is located adjacent to a root of said extending portion.

30. A printed circuit board device, comprising:
(A) at least two printed circuit boards in superimposed relation to connect patterns thereon with one another; and
(B) positioning means for use in placing said printed circuit boards in superimposed relation, said positioning means including a hole provided in one of said printed circuit boards, an extending portion provided in the other printed circuit board and inserted into said hole, a mark for position registry provided in said one printed circuit board and a cutout provided in said other printed circuit board and having a predetermined relation with said mark for position registry, said mark for position registry is of a round shape, and wherein said cutout is in the shape of a circle of a larger diameter than that of said round shape.

31. A device according to claim 30, wherein said printed circuit boards are flexible printed circuit boards.

32. A device according to claim 30, wherein said patterns for connection and said mark for position registry are comprised of a same copper foil.

33. A device according to claim 30, wherein at least one of said patterns for connection protrudes from a substrate of one of said printed circuit boards.

34. A device according to claim 30, wherein said patterns for connection each are plural in number and arranged in a row.

35. A printed circuit board device comprising:
(A) at least two printed circuit boards in superimposed relation to connect .patterns thereon with one another; and
(B) positioning means for use in placing said printed circuit boards in superimposed relation, said positioning means including a hole provided in one of said printed circuit boards, an extending portion provided in the other printed circuit board and inserted into said hole, a mark for position registry provided in said one printed circuit board and a cutout provided in said other printed circuit board and having a predetermined relation with said mark for position registry, said mark for position registry is of a round shape, and wherein said cutout is in the shape of a semicircle of a larger diameter than that of said round shape.

* * * * *

UNITED STATES PATENT AND TRADEMARK OFFICE
CERTIFICATE OF CORRECTION

PATENT NO. : 5,418,691
DATED : May 23, 1995      Page 1 of 2
INVENTOR(S) : Go Tokura It is certified that error appears in the above-indentified patent and that said Letters Patent is hereby corrected as shown below:

Cover page, Item [54], line 1. Change "CIRCIUT" to -- CIRCUIT --.

Cover page, Item [75], After "Kanagawa" insert -- -ken --.

Col. 1, line 2. Change "CIRCIUT" to -- CIRCUIT --.

Col. 2, line 25. After "of" insert -- a --.

Col. 2, line 26. Change "a" to -- the --.

Col. 2, line 50. Change "." to -- ; and --.

Col. 3, line 2. Change "l" to -- $\ell$ --.

Col. 3, line 61. Delete "'".

Col. 4, line 24. After "Because" insert -- of --.

Col. 4, line 30. After "boards" insert -- , --.

Col. 4, line 38. Change "l" to -- $\ell$ --.

Col. 5, line 10. After "shows" insert -- an example of --.

UNITED STATES PATENT AND TRADEMARK OFFICE
CERTIFICATE OF CORRECTION

PATENT NO. : 5,418,691
DATED : May 23, 1995
INVENTOR(S) : Go Tokura

It is certified that error appears in the above-indentified patent and that said Letters Patent is hereby corrected as shown below:

Col. 5, line 53. Change "a" to -- an --.

Signed and Sealed this

Twenty-sixth Day of September, 1995

*Attest:*

BRUCE LEHMAN

*Attesting Officer*     *Commissioner of Patents and Trademarks*